United States Patent [19]

Danby et al.

[11] Patent Number: 5,124,651
[45] Date of Patent: Jun. 23, 1992

[54] NUCLEAR MAGNETIC RESONANCE SCANNERS WITH COMPOSITE POLE FACINGS

[75] Inventors: Gordon T. Danby, Wading River; Hank Hsieh, Ronkonkoma; John W. Jackson, Shoreham, all of N.Y.

[73] Assignee: Fonar Corporation, Melville, N.Y.

[21] Appl. No.: 602,494

[22] Filed: Oct. 24, 1990

[51] Int. Cl.⁵ .......................................... G01R 33/20
[52] U.S. Cl. .................................... 324/318; 324/319
[58] Field of Search ............... 324/300, 307, 309, 318, 324/319, 320, 322; 335/216, 298; 128/653 A

[56] References Cited

U.S. PATENT DOCUMENTS

| | | | |
|---|---|---|---|
| 4,673,882 | 6/1987 | Buford | 324/320 |
| 4,679,022 | 7/1987 | Miyamoto et al. | 324/319 |
| 4,682,111 | 7/1987 | Hughes | 324/320 |
| 4,707,663 | 11/1987 | Minkoff et al. | 324/318 |
| 4,723,116 | 2/1988 | Muller et al. | 324/320 |
| 4,937,545 | 6/1990 | Chaillout et al. | 324/318 |
| 4,943,774 | 7/1990 | Breneman et al. | 324/318 |
| 4,980,641 | 12/1990 | Breneman et al. | 324/318 |
| 5,061,897 | 10/1991 | Danby et al. | 324/319 |

*Primary Examiner*—Michael J. Tokar
*Attorney, Agent, or Firm*—Lerner, David, Littenberg, Krumholz & Mentlik

[57] ABSTRACT

A medical NMR scanner having a primary field magnet assembly is disclosed. The scanner includes a ferromagnetic frame defining a patient-receiving space adapted to receive a human body. It also includes a pair of opposed polar regions aligned on a polar axis. The polar regions are disposed on opposite sides of the patient-receiving space. Structure including either electrical windings or a permanent magnet is provided in each of the polar regions for producing a magnetic field within the patient-receiving space. Windings positioned in proximity to each of the polar regions are provided for producing gradients in the magnetic field, when energized. A plurality of ferromagnetic elements positioned in side-by-side relation to one another in each of the polar regions is provided for limiting eddy current generation in the polar regions when the gradient producing auxiliary coils are energized. Each of the ferromagnetic elements has its shortest dimension oriented generally perpendicular to the polar axis. The ferromagnetic elements comprise rods which are positioned generally parallel to one another and to the polar axis in one form of the invention. In another form of the invention the ferromagnetic elements comprise generally rectangular, planar laminations the planes of which are positioned generally parallel to the polar axis.

23 Claims, 9 Drawing Sheets

NUCLEAR MAGNETIC RESONANCE SCANNERS WITH COMPOSITE POLE FACINGS

BACKGROUND OF THE INVENTION

The present invention pertains to medical nuclear magnetic resonance scanners, and, more particularly, to the structure employed in connection with achieving a desired static and dynamically uniform magnetic field in the patient scanning area thereof.

Since the invention of the medical nuclear magnetic resonance (NMR) scanning technique by Dr. Raymond Damadian, as set forth in U.S. Pat. No. 3,789,832, this technique has been widely adopted in the medical arts. Medical NMR scanning requires creation of a substantial constant "primary" magnetic field passing through the patient's body. Additional "gradient" magnetic fields varying with time typically are superimposed on the primary field. The patient is exposed to radio frequency electromagnetic waves which also vary with time in particular patterns. Under the influence of the magnetic fields and the radio waves, certain atomic nuclei within the patient's tissues resonate and emit further radio waves. By known mathematical techniques involving correlation of the magnetic field patterns in use at various times with the radio frequency waves emitted, it is possible to determine the amount and/or physical state of particular atomic nuclei, or a physical condition at various locations within the patient's body. This information typically is displayed as an image with shadings corresponding to the concentration and/or physical state of certain nuclei of interest. Alternatively, it can be displayed as spectral information. The concentrations or physical state of different substances ordinarily differ for differing kinds of tissues. Thus, the image created by NMR techniques permits the physician to see organs and soft tissues within the body, and also permits the physician to see abnormalities, such as tumors, within the body. Accordingly, NMR scanning and imaging techniques are being adopted rapidly by physicians.

Medical NMR scanning imposes certain challenging technical requirements for the apparatus. The primary magnetic field must be a strong field, typically from less than 1 kilogauss to more than 10 kilogauss (1 Tesla). This is far stronger than the magnetic fields associated with many common magnets. Moreover, the primary magnetic field must be precisely configured. Thus, the primary field, before application of the gradient fields, should be uniform to at least about 1 part in 1,000 and preferably at least about 1 part in 10,000 or better, over the imaging volume, in order to provide a useful image. Even better uniformity is more desirable. This strong uniform primary magnetic field must be maintained over a region of the patient's body large enough to provide medically useful information, typically over a scanning region encompassing a major portion of a cross section through the patient's torso. Further, the magnetic field apparatus typically must be arranged to receive the patient's body, and hence must provide openings large enough for the patient's body to fit within the apparatus. All these requirements, taken together, pose a formidable technical problem.

Two distinct and fundamentally different approaches to these requirements are currently employed in construction of medical NMR scanners. As set forth in commonly assigned U.S. Pat. No. 4,675,609 to Danby et al., magnetic field producing means such as permanent magnets or excitation coils can be combined with a ferromagnetic metal frame and other components to form a magnetic assembly which provides the primary field. The disclosure of said U.S. Pat. No. 4,675,609 is hereby incorporated by reference herein. Medical NMR scanners incorporating magnetic assemblies according to U.S. Pat. No. 4,675,609 have excellent primary fields and hence offer good scanning capabilities.

The other approach has been to employ essentially solenoidal electromagnets having resistive or superconducting windings. The windings of a superconducting magnet under appropriate temperature conditions lose resistance to flow of electric current. Thus, superconducting magnets can carry large currents and can create high fields. Some superconducting electromagnets have been built as essentially air core solenoids, with only minor ferromagnetic elements. Alternatively, as set forth in commonly assigned U.S. Pat. No. 4,766,378 to Danby et al., superior superconducting magnets for NMR scanners can be made using a ferromagnetic frame to direct and shape the flux into the patient-receiving space and to provide a flux return path.

As indicated earlier, and as may be seen in the aforesaid commonly assigned U.S. Pat. No. 4,766,378, gradient coils are used to superimpose gradient magnetic fields on the primary field generated by the primary field generating apparatus, such as primary windings or permanent magnets. The gradient coils are disposed within the frame, adjacent the patient-receiving space. The available space within the frame is limited, in that large openings within the frame tend to reduce the strength of the primary field. To provide a patient-receiving space of adequate size, the gradient coils ordinarily are disposed in proximity to the ferromagnetic materials of the primary magnetic field assembly. It is typically desirable in NMR scanning to vary the gradient fields imposed by the gradient coils at relatively rapid rates. This results in the creation of eddy currents in the ferromagnetic materials, which in turn cause undesirable non-uniformities in the magnetic field. The aforementioned '378 patent discloses certain magnet configurations which provide enhanced clearance within the frame, and hence allow increased distance between the gradient coils and the ferromagnetic materials.

Despite these improvements there has been a significant need heretofore for further improvement with respect to increasing the uniformity of the main magnetic fields of medical NMR scanners by reducing the non-uniformities introduced therein due to gradient-coil-induced eddy currents. Moreover, some versions of the scanners disclosed in the '378 and '609 patents have limited clearances therein and thus also have need of the present invention.

SUMMARY OF THE INVENTION

The present invention provides NMR scanners which meet those needs.

One aspect of the present invention provides a medical NMR scanner having a primary field magnet assembly including a frame that defines a patient-receiving space. The frame includes a pair of opposed polar regions aligned on a polar axis and disposed on opposite sides of the patient-receiving space. The primary field magnet assembly also includes means for producing a magnetic field within the patient-receiving space by directing at least a portion of the flux through the polar regions of the frame. It is also provided with means including gradient coil windings positioned in proximity to each of the polar regions for producing gradients in the magnetic field when energized; and, means for limiting eddy current generation in the polar regions when the gradient producing means is energized including an assembly of plural ferromagnetic elements in each of the polar regions, the ferromagnetic elements in each said assembly being positioned in side-by-side relation to one another each of said elements having its shortest dimension oriented generally perpendicular to the polar axis.

In preferred aspects of the invention the ferromagnetic elements comprise either rods which are aligned generally parallel to the polar axis or sheet like, generally planar laminations, the planes of which are aligned generally parallel to such axis. Because such elements extend generally parallel to the polar axis, they effectively conduct the magnetic flux in the axial direction. In this respect, the ferromagnetic elements serve essentially the same function as a solid ferromagnetic component. However, since they do not effectively conduct electrical currents through circuits extending over substantial distances in directions transverse to the polar axis, they effectively inhibit formation of eddy currents in the polar regions.

The frame of the primary field magnet desirably is comprised of ferromagnetic material, typically iron, and includes a substantially continuous ferromagnetic flux return path extending between the polar regions remote from the patient-receiving space. The means for producing the magnetic field in the patient-receiving space may comprise either permanent magnets positioned in the polar regions of the frame, or electrical primary windings which encircle the polar regions thereof.

The foregoing features serve to enhance the quality and speed of scanning and, thus, the present invention offers considerable improvement in the medical NMR scanning apparatus.

The use and other objects, features and advantages of the present invention will be more readily apparent from the detailed description of the preferred embodiments set forth below, taken in conjunction with the accompanying drawings.

BRIEF DESCRIPTION OF THE DRAWINGS

FIG. 11 is an enlarged fragmentary sectional plan view, taken along the line 11—11 of FIG. 9.

DETAILED DESCRIPTION OF THE PREFERRED EMBODIMENTS

Figure 1:
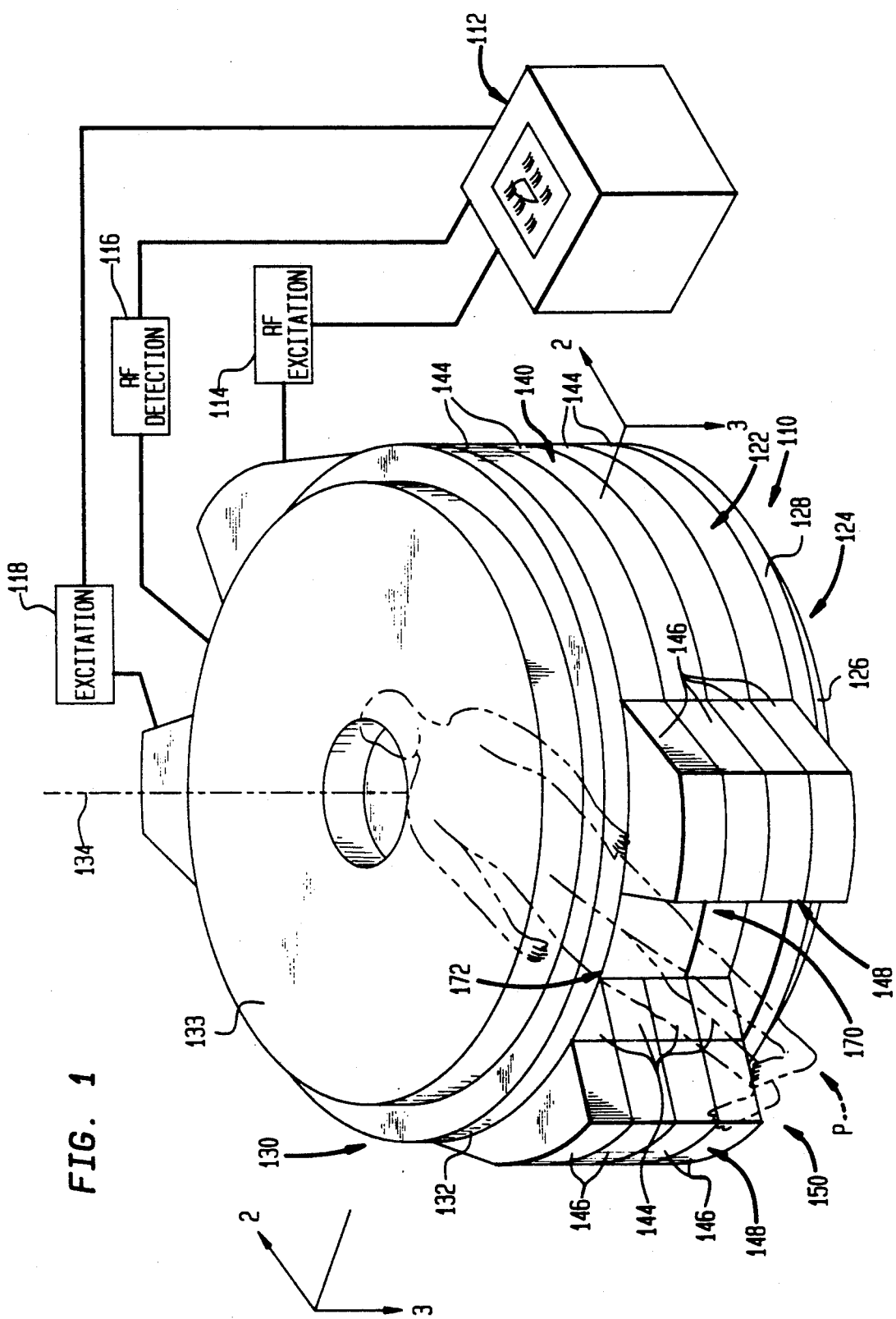
FIG. 1 is a schematic perspective view of apparatus according to one embodiment of the present invention, with some components thereof shown in block form.

Referring to FIGS. 1-5A, a nuclear magnetic resonance scanner according to one aspect of the present invention includes a primary field magnet assembly 110 and a conventional control, computing and image display unit 112. The apparatus also incorporates conventional RF excitation and RF detection units 114 and 116 which are linked to control unit 112. Also, conventional gradient coil excitation means 118 are linked to control unit 112 and to gradient field coils 120 (FIG. 2) disposed within the primary field magnet assembly 110.

Primary field magnet assembly 110 includes a frame 122 formed from a "magnetically soft" ferromagnetic material. As utilized herein the term "magnetically soft" refers to a material which can be readily magnetized, i.e., a material of low coercive force. The term "ferromagnetic", as used herein, is intended to include ferrimagnetic materials as well as ferromagnetic materials. Low carbon steel is the preferred material for the frame and is employed for all components of frame 122 unless otherwise indicated below. The frame includes a lower end piece 124 comprising a ring-like bottom plate 126 and a circular lower plate 128, and a similar upper end piece 130 comprising a circular upper plate 132 and an upper ring-like plate 133. All of these plates are substantially coaxial with one another, so that end pieces 124 and 130 are aligned with one another on a vertical polar axis 134. The end pieces are substantially parallel with one another.

Frame 122 includes a ferromagnetic lower pole piece 162 that projects axially inwardly, from the lower end piece 124 towards a medial plane 135. As used in this disclosure, the term "axially inwardly" refers to directions parallel to the polar axis, toward the medial plane, and the term "transverse" refers to directions generally perpendicular to the polar axis. The lower pole piece 162 terminates at a lower pole face 163 relatively close to the patient-receiving space 158. Lower pole piece 162 includes a cylindrical lower pole stem 164 and a frustoconical pole facing piece 165 which tapers inwardly to the lower pole face 163.

Figure 5A:
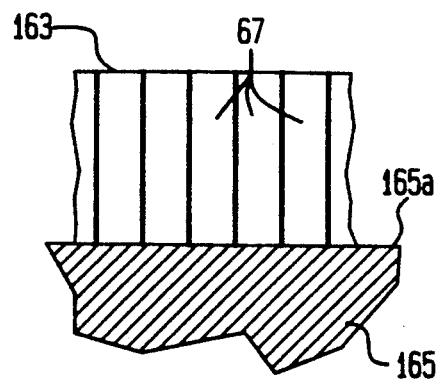
FIGS. 5A and 5B are schematic sectional elevation views on enlarged scales depicting two arrangements of ferromagnetic rods for limiting eddy current generation in the polar regions of the primary field magnet assembly.
Figure 5B:
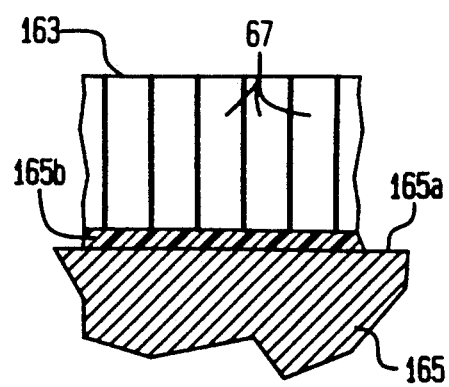

The lower pole piece 162 includes a lower shim ring 159 covering the peripheral portion of lower pole face 163. Pole piece 162 also includes a plurality of narrow elongated, ferromagnetic rods 67 positioned in side-by-side relation to one another, the inboard ends of which form the lower pole face 163 and the outboard ends of which may either be in or out of direct metal-to-metal abutting contact with a recessed surface 165a formed in pole facing piece 165, as shown in enlarged scale in FIGS. 5A and 5B, respectively. Desirably, there is a gap between the outboard ends of rods 67 and the surface 165a of pole facing piece 165. This gap may be filled with an electrically non-conductive material 165b (FIG. 5B). The ferromagnetic rods 67, which are axially generally aligned with the polar axis 134, are adhesively bonded to one another and transversely electrically separated from one another by an epoxy resin or other suitable electrically non-conductive bonding material, in which they are embedded. The rods 67 may be bonded together into the form of a short, wide cylindrical disk or block which is retained against the recessed surface 165a, in tight contact therewith, by the shim ring 159, which is bolted to pole facing piece 165 and has an inner peripheral portion which overlies the outer peripheral portion of such disk. Alternatively, the rods 67 may continue radially outwardly to the outer radius of lower pole facing piece 165 and the shim ring 159 may comprise extensions of the radially outer rows of the rods. In this case additional external non-magnetic structure (not shown) would be employed to provide radial support. Preferably, the ratio of the amount of ferromagnetic material to electrically non-conductive material in any given transverse plane through rods 67 is selected to be as high as possible consistent with maintaining the rods out of electrical contact with one another.

The ferromagnetic rods 67 each have a maximum length dimension that is at least five times greater than the maximum width dimension thereof, and is preferably in the range of ten to forty times greater than the maximum width dimension thereof. They are preferably made of a magnetically permeable alloy such as 1008 steel, soft iron, or the like. Since the rods are transversely electrically separated from one another by an electrically non-conductive bonding medium, eddy current generation in the plane of the pole face 163, caused by the energization of the gradient coils 120 in a polar region 170 of the primary field magnet assembly, is limited. As shown in FIG. 5B, the outboard ends of the ferromagnetic rods 67 desirably are not in direct metal-to-metal contact with the surface 165a of pole facing piece 165 but can, alternatively, be electrically non-conductively spaced from, the surface 165a by a layer 165b of electrically non-conductive material, for example the same epoxy resin as used to separate the rods 67 from one another in the transverse direction or, as a further example, a sheet like non-conductive material such as a phenolic. When an adhesive material such as an epoxy employed as the electrically non-conductive material 165b, it bonds the rods 67 to the pole facing piece 165. When the outboard ends of the rods 67 are not in direct metal-to-metal contact with surface 165a, the length-to-width ratio of the rods may be in the lower portion of their ten-to-forty range. When such ends are in direct metal-to-metal contact with surface 165a, the length-to-width ratio of the rods may preferably be in the upper portion of the ten-to-forty range.

The upper end piece 130 is provided with a similar upper pole piece 166 including cylindrical upper pole stem 167, frustoconical upper pole facing piece 168, upper pole face 169, upper shim ring 171 projecting axially inwardly beyond the coil plane 191 of upper coil ring 190, and ferromagnetic rods 67 adhesively bonded to one another transversely in an electrically non-conductive arrangement. The end faces 163 and 169 and shim rings 159 and 171 cooperatively define the opposed polar regions 170 and 172 surrounding the polar axis 134 and facing toward one another. The polar regions 170 and 172 cooperatively define a theoretical medial plane 135 equidistant between them. Medial plane 135 is also equidistant between end pieces 124 and 130. The term "center point" refers to the point 137 at the intersection of the polar axis and the medial plane. The pole faces 163 and 169 of the ferromagnetic frame are, thus, closely juxtaposed with the patient-receiving space 158 and with the center point 137.

Figure 2:
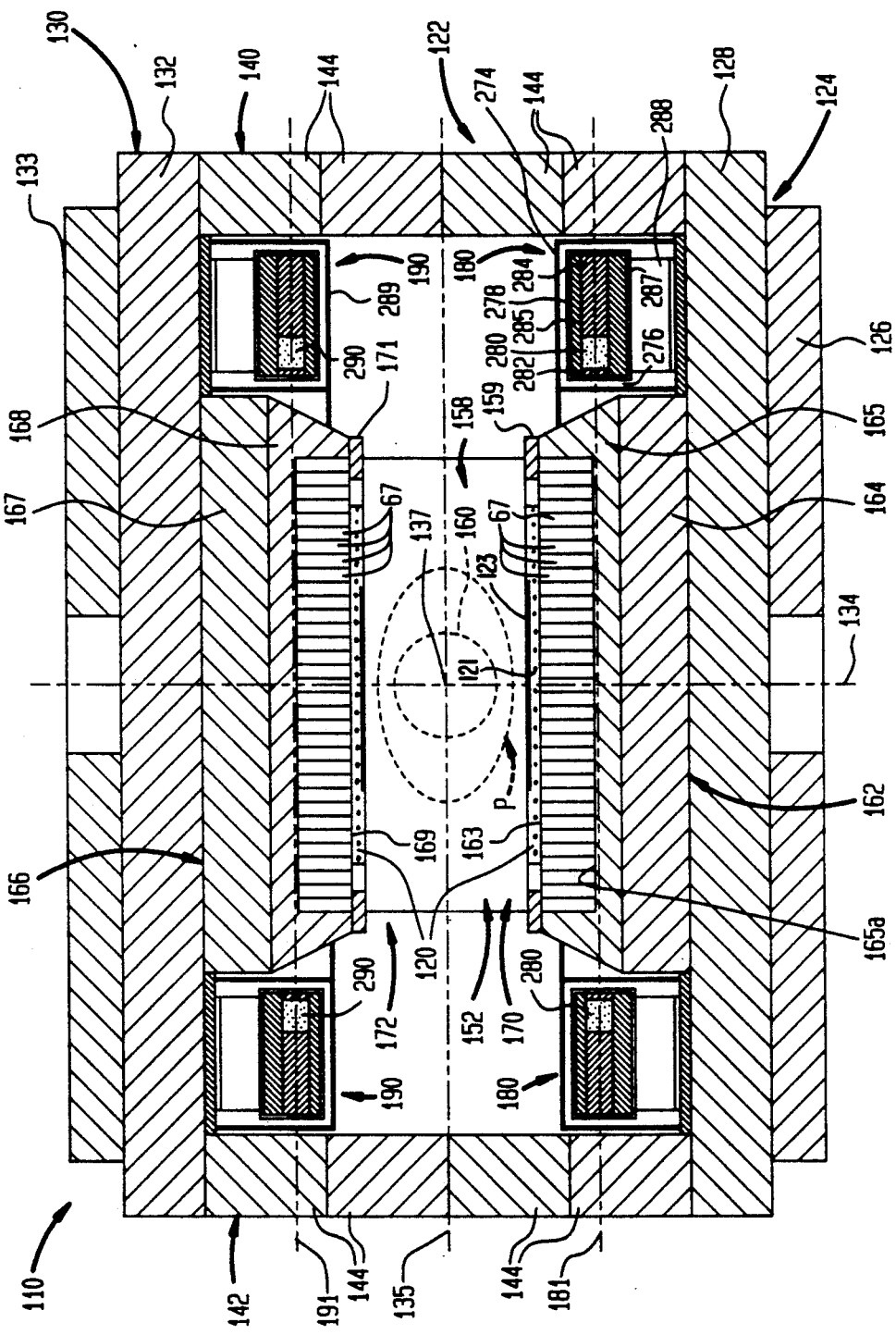
FIG. 2 is a schematic sectional elevation view, taken along the line 2—2 in FIG. 1.

Top end piece 130 of the frame is supported above bottom end piece 124 thereof by axial connectors 140 and 142, which form part of the frame and substantially encompass the patient-receiving space 158, except for patient entry openings 152, of which only one is visible in FIG. 2. Each axial connector is generally in the form of a segment of a right circular cylinder coaxial with polar axis 134. Each of these axial connectors includes four superposed sectors 144. Each of the sectors 144 is provided with a pair of projections 146 extending outwardly, away from one another at opposite ends of the sector. These projections 146 are superposed on one another and form columns 148 extending parallel to polar axis 134 at the edges of the axial connectors 140 and 142.

Figure 3:
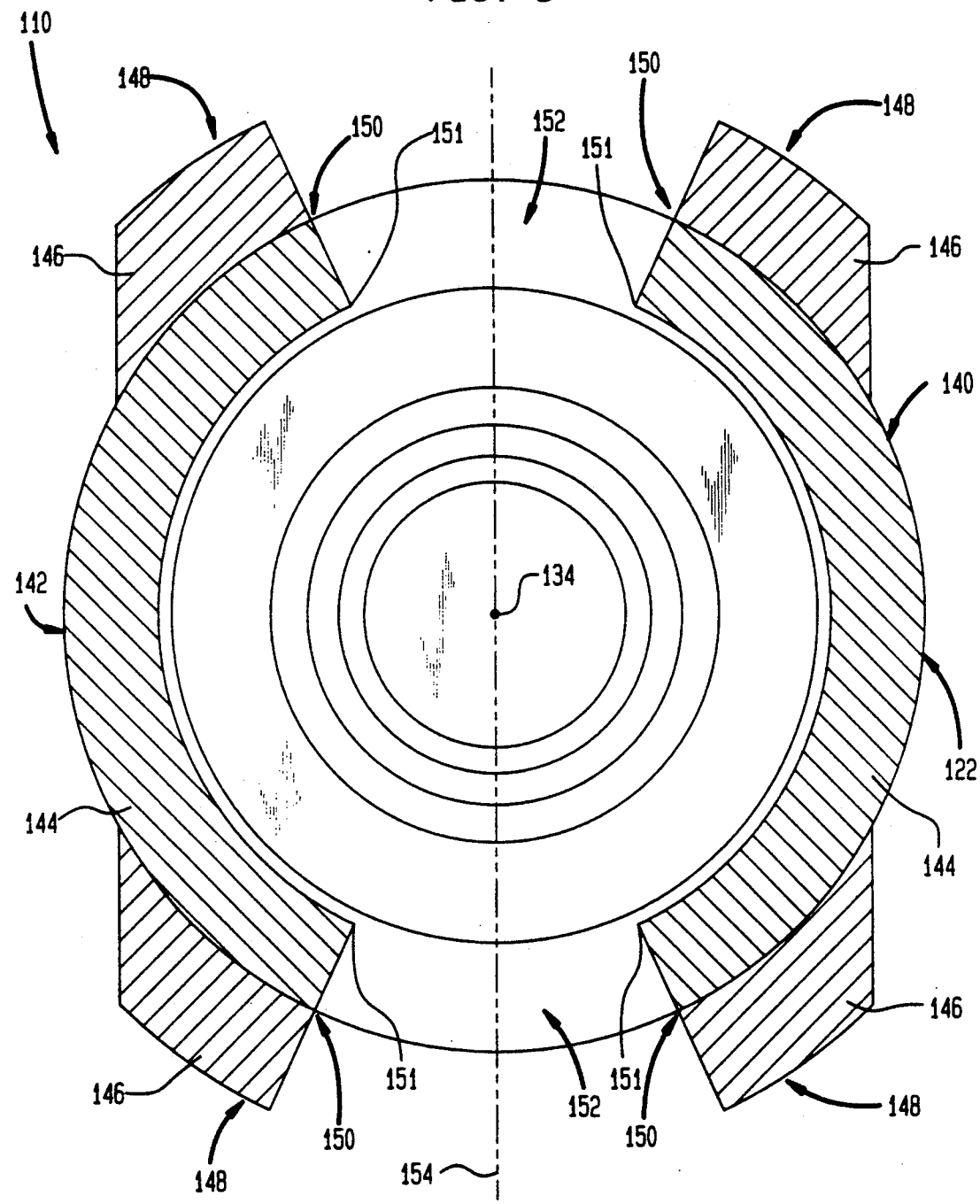
FIG. 3 is a schematic sectional plan view, taken along the line 3—3 in FIG. 1.
Figure 4:
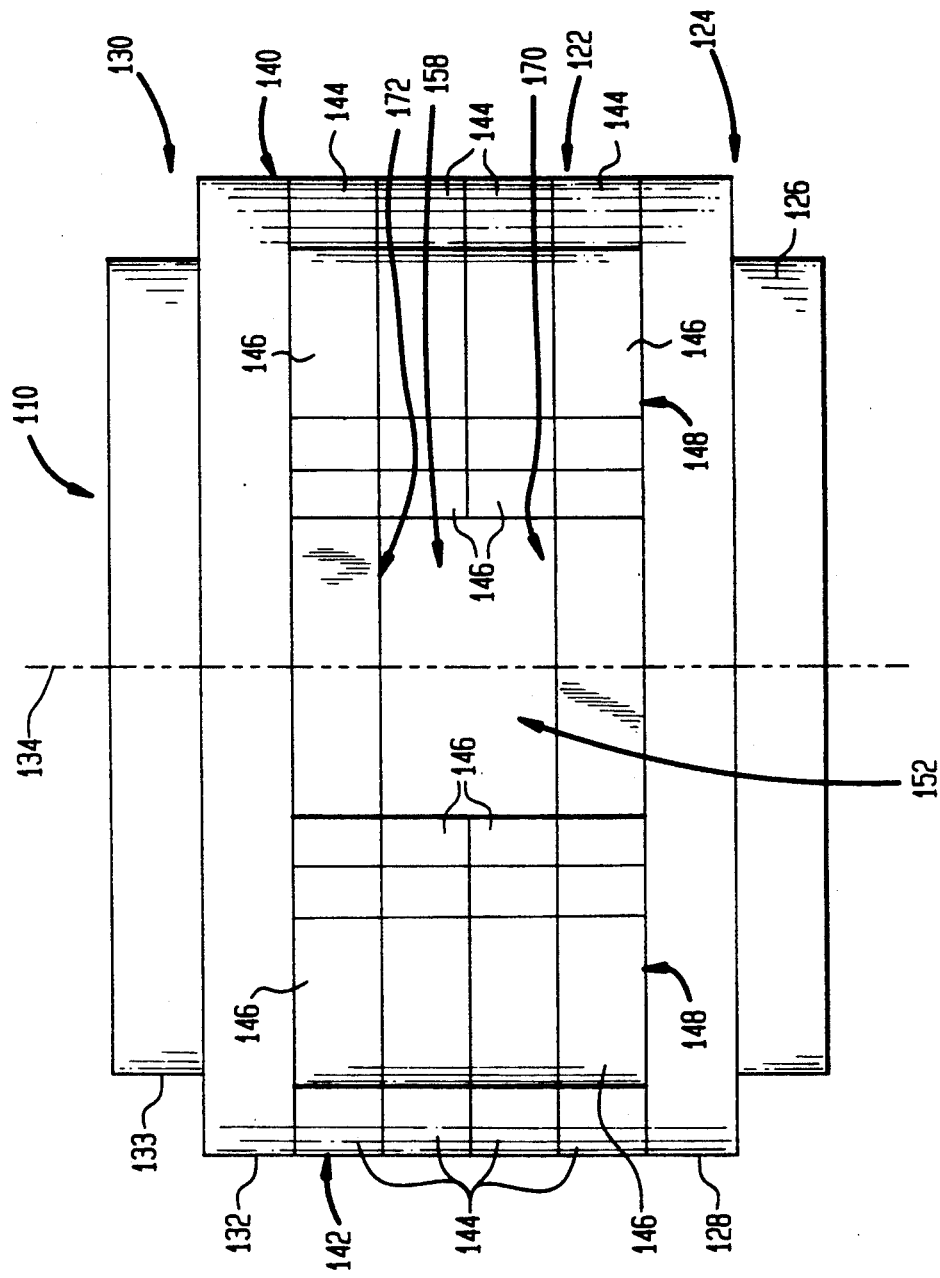
FIG. 4 is a schematic elevational view of the apparatus shown in FIGS. 1—3.

As best seen in FIGS. 1 and 3, the edges of the individual sectors 144 and projections 146 are bevelled so that the faces of the sector rings 144 and projections 146 cooperatively define generally planar surfaces 150 at the edges of axial connectors 140 and 142, these planar faces extending along substantially radial planes with respect to polar axis 134. The edges 151 of planar faces 150 closest to polar axis 134 define a pair of patient entry openings 152 leading from the outside of the frame to the space between end pieces 124 and 130. These openings are aligned with one another along a patient entry axis 154 orthogonal to polar axis 134. Openings 152 are of sufficient size for the body, i.e., the torso of a normal human adult, to be inserted therethrough. Appropriate means, preferably including a non-metallic, non-magnetic bed (not shown) are provided for positioning a patient P via the openings, so that the patient's body is positioned in the patient-receiving space 158 between polar regions 170 and 172. A particular region of the patient's body to be scanned preferably is positioned within a predetermined scanning volume 160, which is a subregion of patient-receiving space 158 surrounding center point 137.

The primary field magnet assembly 110 also includes a lower superconducting coil assembly 180 and an upper superconducting coil assembly 190. Lower coil assembly 180 includes a toroidal, vacuum-tight container or cryostat vessel 274 formed from aluminum or another non-magnetic metal, insulation 276 disposed within vessel 274 and a liquid helium container 278 disposed within insulation 276. A coil 280 of conventional superconductive wire is mounted within liquid helium container 278. Coil 280 is generally loop-like and circular and defines an axis coincident with polar axis 134 and a coil plane 181 parallel to the medial plane 135. As used in this disclosure, the term "coil plane" refers to the central plane of the coil, i.e., to the plane perpendicular to the axis of the coil, bisecting the coil.

An inner anti-buckling ring 282 is mounted within coil 280, and an outer clamping ring 284 encircles the coil, rings 282 and 284 also being concentric with polar axis 134. Coil 280 and rings 282 and 284 are supported within helium container 278 by a plastic washer (not shown) bearing on the coil and a pair of solid stainless steel support rings 285 and 287. The liquid helium container 278 closely surrounds the assembly comprising elements 280, 282, 284, 285 and 287, the liquid helium container being disposed within the insulation 276 positioned internally of the vacuum vessel 274. The liquid helium container is supported within the vacuum container 274 by coil support legs 288 which penetrate through insulation 276. A plurality of coil support legs 288 are placed on the periphery of this toroidal assembly. These legs are arranged to accommodate shrinkage of the coil and rings which occurs when the coil and rings are cooled. Appropriate means (not shown) are provided for feeding current to coil 280, and for feeding liquid helium into the liquid helium container and evacuating the interior of vessel 274. Thus, vessel 274 and the associated components serve as cryostat means for maintaining coil 280 at the low temperatures, close to absolute zero, below the critical temperature of the superconducting material in coil 280, where the material of the coil exhibits superconductivity.

Upper coil assembly 190 is of substantially the same construction as the lower coil assembly. Thus, the superconductive coil 290 of upper coil assembly 190 likewise has a coil axis coincident with polar axis 134, and a coil plane 191. The upper coil assembly also includes support and insulating structure as described, including a toroidal cryostat vessel 289. Coils 280 and 290 are disposed symmetrically with respect to medial plane 135.

The gradient coils 120 are disposed within the primary field magnet assembly 110, along polar axis 134, on opposite sides of the patient-receiving space 158. Conventionally, two sets of gradient coils 120 are provided in each of the polar regions 170 and 172 to facilitate providing gradients in the magnetic field in two orthogonal directions that are perpendicular to each other and to the polar axis 134. A third set of gradient coils (not shown) is also conventionally installed so that the coils thereof lie on opposite sides of the polar axis and so that an axis connecting such coils is transverse to the polar axis. Such coils provide gradients in the magnetic field along the polar axis.

The lower set of gradient coils incorporates a plurality of windings 121 extending generally parallel to one another in one direction transverse to polar axis 134 and a further plurality of windings 123, of which only one is partially visible in FIG. 2, extending generally perpendicular to conductors 121 and also extending generally transverse to polar axis 134. Windings 121 and 123 are embedded in a non-conductive, non-magnetic material, which may be a polymeric resin such as an epoxy resin. The upper gradient coil 120 incorporates similar windings. The gradient coils 120 per se are conventional and, accordingly, need not be described in detail herein. However, in this embodiment of the present invention the gradient coils 120, and hence windings 121 and 123 are disposed adjacent patient space 158 and scanning volume 160, adjacent to the lower and upper pole faces 163 and 169.

In the scanning procedure, control means 112 and gradient excitation means 118 operate gradient coils 120 to provide relatively small magnetic fields varying in time in a known manner, and these magnetic fields are superimposed on the primary field created by the primary field magnet assembly 110 within the scanning volume 160. The control means 112 also cooperates with RF excitation means 114 and RF detection means 116 to apply appropriate radio frequency signals to that portion of the patient's body disposed within scanning volume 160 and to detect the resulting RF nuclear magnetic resonance signals from those portions. As well known to those skilled in the art of medical NMR imaging, appropriate mathematical processing is applied by control means 112 to relate the operation of the gradient coils and RF excitation means and the detected signals so as to create an image of the bodily structures located in scanning volume 160.

The magnetic flux generated by the flowing currents in coils 280 and 290 interacts with the frame 122. The polar regions carry high axially-directed magnetic fields, so that the magnetic flux passes between these regions and substantially parallel to polar axis 134. The axial connectors 140 and 142 and the columns 148 extending along the margins of the axial connectors form flux return paths extending parallel to the polar axis between the end pieces 124 and 130. These flux paths serve to carry the return lines of flux, i.e., the lines of flux extending counter-directionally to the flux between the polar regions. As will be appreciated, the coils 280 and 290 are substantially disposed within an enclosed shell defined by frame 122, and the flux generated by these coils is substantially confined to the interior of the shell and to within the shell walls. The flux outside of the frame is essentially zero. Because the field is essentially confined within the frame, disturbance outside the frame, as may be caused by moving metallic objects, will not appreciably affect the field within the frame, and particularly will not affect the field within the scanning volume 160. Of course, because the field is confined in this fashion, magnetic materials outside of the device will not be attracted or propelled by the field and hence will not pose a safety hazard.

Ferromagnetic frame 122 provides flux concentration at the scanning volume 160 surrounding center point 137. Substantially all of the flux entering scanning volume 160 passes through the frame, and specifically through the pole pieces 162 and 166. The tapering configuration of the pole pieces 162, 166 and the shim rings 159, 171 aid in shaping the "fringing" field remote from the polar axis, and hence aid in shaping the field in the scanning volume. The ferromagnetic rods 67 conduct the flux passing through pole pieces 162 and 167 into the patient-receiving space 158. In this respect, the layers of ferromagnetic rod 67 act essentially as parts of the pole pieces 165 and 168. The ferromagnetic rods provide a low reluctance flux path into the patient-receiving space. The magnetic reluctance along the primary flux path, through the pole pieces, through the layers of ferromagnetic rods 67 and through the patient-receiving space is essentially the same as the reluctance would be if the ferromagnetic rods were omitted and the space occupied by the ferromagnetic rods were filled with a solid ferromagnetic material.

As the gradient coils are energized by gradient coil excitation apparatus 118, electrical currents are directed through various ones of the windings 121 and 123 so as to generate magnetic field gradients within patient space 158. These currents also produce some magnetic flux directed away from the patient-receiving space 158, towards the pole facing pieces 165 and 168. As the currents through the windings 121 and 123 are varied to change the gradient within applied patient space 158, the flux directed toward the pole facing pieces also changes. Accordingly, the potential for eddy current generation in the pole facing pieces 165 and 168 exists during operation of the apparatus.

The layers of ferromagnetic rods 67 substantially suppress such eddy currents. The magnetic flux emanating from windings 121 and 123 and directed toward pole facing piece 165 passes back to the windings principally through the layer of ferromagnetic rods 67 rather than through the pole facing piece 165. That is, the magnetic reluctance along flux paths from the windings, through the layer in directions generally in the plane of the layer (and generally transverse to polar axis 134) and back to the windings desirably is less than the magnetic reluctance along flux paths from the windings, into the pole facing piece 165 and back to the windings. Because little or none of the flux from the gradient coil windings passes through the pole facing piece or the underlying solid ferromagnetic structures, changes in the flux from the gradient coil windings during operation of the apparatus will not induce substantial eddy currents in these solid ferromagnetic metallic structures. As appreciable amounts of flux from the gradient coil windings do pass through the layer of ferromagnetic rod like element 67, changes in the flux from the gradient coil windings may induce appreciable electromagnetic potentials within this layer. However, these electromagnetic potentials will not result in appreciable eddy currents because the individual rods 67 are substantially electrically isolated from one another by the electrically non-conductive material surrounding the rods, and, preferably, by the further electrically non-conductive material 165b (FIG. 5B) interposed between the rod 67 and the underlying pole facing piece 165. Stated another way, there is an extremely high electrical resistance along the paths which would be taken by eddy currents if the layer of rod 67 was formed from a solid, unitary block of a metallic, conductive material. The block 67 disposed adjacent the upper pole facing piece 168 substantially suppress eddy currents from the windings of upper gradient coil 120 in substantially the same way.

The efficacy of eddy current suppression is directly related to the proportion of flux from the windings directed through the layer of rod like or individual elements 67 rather than through the underlying solid metallic elements such as pole facing piece 165. The thickness of the layer of rod like elements 67 required to direct a given proportion of the flux through this layer will depend upon the magnetic permeability of the material in the rod like elements and, to a greater extent, upon the proportion of the layer occupied by the ferromagnetic material of the rods. To provide the lowest possible magnetic reluctance through the layer of rod like elements, it is desirable to make the proportion of the layer occupied by the rods 67 as great as possible and hence to minimize the space within the layer occupied by the non-conductive material. Thus, the rods should be packed as closely as practicable in the layer, leaving only enough of the electrically and non-conductive material to provide continuous electrical insulation between adjacent rods and to bond the rods securely in place. With typical rod configurations and with materials as discussed above, the layer of rods should be at least about 100 mm thick in order to assure that the major portion of the flux from the windings passes through this layer. Stated another way, each rod is desirably at least about 100 mm long in the direction parallel to the polar axis 134.

Figure 6A:
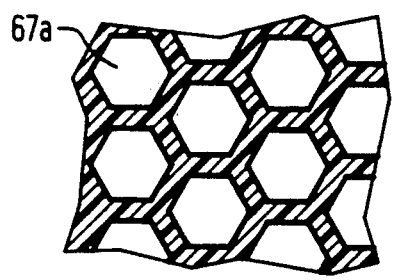
FIGS. 6A–6C are enlarged partial plan views of the ferromagnetic rods in the eddy current generation-limiting means, showing various cross-sectional shapes that such ferromagnetic rods may take.
Figure 6B:
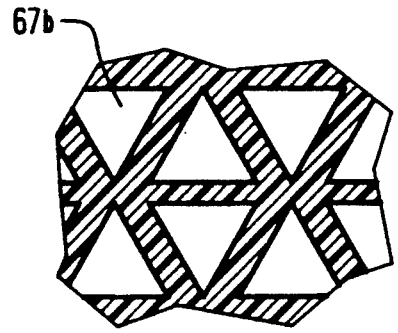
Figure 6C:
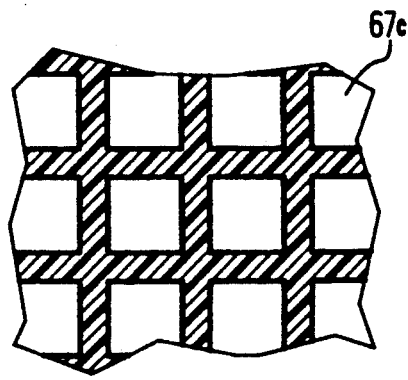
Figure 7:
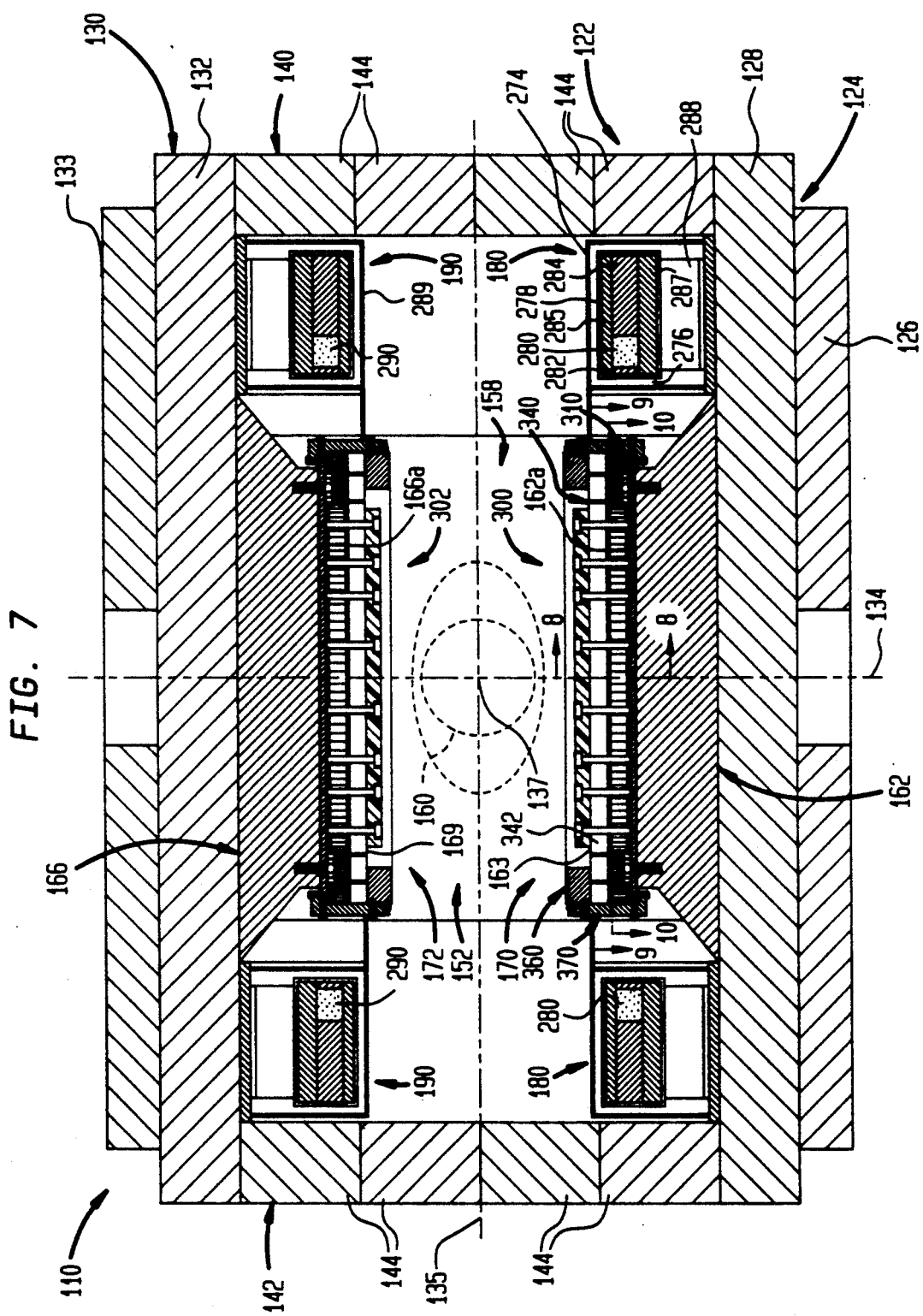
FIG. 7 is a schematic, sectional elevation view, similar to FIG. 2, but showing another embodiment of the present invention involving orthogonal stacks of laminations.

As illustrated in FIGS. 6A-6C, the cross-sectional shape of the ferromagnetic rods 67 may take the form of polygons such as hexagons 67a (FIG. 6A) triangles 67b (FIG. 6B); quadrilaterals such as squares. 67c (FIG. 6C), or various combinations of such forms, provided the rods are maintained out of transverse electrical contact with one another by an electrically non-conductive material such as epoxy resin. In a preferred version of this embodiment of the invention, the ferromagnetic rods have cross-sectional shapes that take the form of hexagons, triangles or quadrilaterals. As will be appreciated, the thickness of the electrically non-conductive material between the rods is greatly exaggerated in each of FIGS. 6A-6C.

Other of the features described above can also be varied significantly. Merely by way of example, the apparatus can be oriented differently, so that the polar axis extends horizontally, rather than vertically as shown. The shim rings mentioned above can be detachably mounted to the remainder of the frame, so that other cylindrical ferromagnetic rod disks and other shim rings can be substituted for the original disks and shim rings. The shim rings may be formed from ferromagnetic rods, rather than the annular plates shown. The ferromagnetic rods may be formed integrally with the pole facing pieces, for example by saw-cutting kerfs in the inboard end portions of the pole facing pieces, or they may be aligned at a slight angle to the polar axis, or they may have non-uniform lengths or transverse distribution to provide the function of a shim ring.

Referring now to FIGS. 7-11, a nuclear magnetic resonance scanner according to another aspect of the present invention has there been illustrated in an environment similar to that described in connection with the FIGS. 1-6C embodiments. Accordingly, elements in this embodiment of the invention that are similar to those referred to in connection with the embodiments of FIGS. 1-6C have been given the same part numbers in the embodiment of FIGS. 7-11. Thus, for example, the nuclear magnetic resonance scanner of FIGS. 7-11 includes a primary field magnet assembly 110 which includes a frame 122 of ferromagnetic material. The frame 122 includes a lower end piece 124 comprising a ring-like plate 126 and a circular top plate 128, and a similar upper end piece 130 comprising a circular lower plate 132 and an upper ring-like plate 133. All of these plates are substantially co-axial with one another, so that end pieces 124 and 130 are aligned with one another on a vertical polar axis 134. The end pieces are substantially parallel with one another. Frame 122 also includes a ferromagnetic lower pole piece 162 and a ferromagnetic upper pole piece 166. The pole pieces 162 and 166 may be frustoconical in shape and terminate in respective planar inboard end surfaces 162a and 166a.

Laminated pole assemblies, shown generally at 300 and 302, are mounted to the respective inboard end surfaces 162a and 166a of the pole pieces 162 and 166. The laminated pole assemblies 300 and 302 are essentially exact duplicates of one another and, accordingly, only the lower laminated pole assembly 300 will be described in detail, it being understood that a description of the upper laminated pole assembly 302 would be essentially the same as that set forth below for the lower laminated pole assembly.

Referring more particularly to FIGS. 8-11, the lower laminated pole assembly 300 includes a steel base plate 304 the outer surface of which is bolted to the surface 162a of pole piece 162 by means of a plurality of bolts 306. An electrically non-conductive separator 308, for example made of a phenolic material, is positioned against the inboard surface of base plate 304 to electrically insulate the base plate from a first layer of laminations, shown generally at 310. The individual laminations 312 of layer 310 are generally rectangular and planar in form and are arranged in layer 310 with their planes parallel to both the polar axis 134 and to the patient entry axis 154 (FIG. 3), and with their length dimensions extending longitudinally along the patient-receiving space 158. The laminations 312 have various lengths, for example, they may vary in numerous steps from about 1 inch in length to about 43 inches in length, for reasons which will become apparent below. The width of the various laminations is preferably about 2 inches and the thickness of the laminations is about 24 gauge (0.0245 inches). The foregoing dimensions are representative, rather than restrictive, and can be varied significantly from those set forth so long as the length and width dimensions of the lamination each exceed the thickness dimension thereof by a factor of at least 5 times and, preferably, by a factor of more than 40 times. Thus, each lamination 312 is a relatively thin, sheet like element having major dimensions (length and width) and a minor or smallest dimension (thickness) substantially less than either of the major dimensions. The smallest or minor dimension of each such lamination extends horizontally, i.e., substantially perpendicular to the polar axis 134 of the apparatus.

The various laminations 312 are preferably made of electrical grade silicon steel, or other thin, ferromagnetic sheet material having a relatively high volume electrical resistivity, typically at least about $40 \times 10^{-6}$ ohm-cm. Each lamination 312 has been coated with an electrically insulating material, for example an epoxy resin or some other core coating material, prior to being assembled into the layer 310. In addition, the laminations 312 are cut into numerous different lengths and preassembled into groups of similar lengths in order that the resulting lamination layer 310 will closely approximate the circular outline of the base plate 304. Thus, for example, representative groups of different lengths of laminates have been identified at 314, 316 and 318. It should be noted, however, that the individual laminations 312 all typically have the same thickness, so that the density of the laminations is the same throughout the layer 310. In addition, a first set of rectangular openings 320 is provided in the layer 310 to accommodate the various bolts 306 that are employed in bolting the base plate 304 (and thus the laminated pole assembly 300) to the pole piece 162. Finally, small blocks 321 of laminations are used to fill the bolt holes 320 after assembly of the bolts 306 to pole piece 162, so that the inboard surface of layer 310 presents a substantially continuous plane above the bolts 306. A layer of insulating material 323 separates each filler block 321 from the bolt 306 that is adjacent to it.

Figure 8:
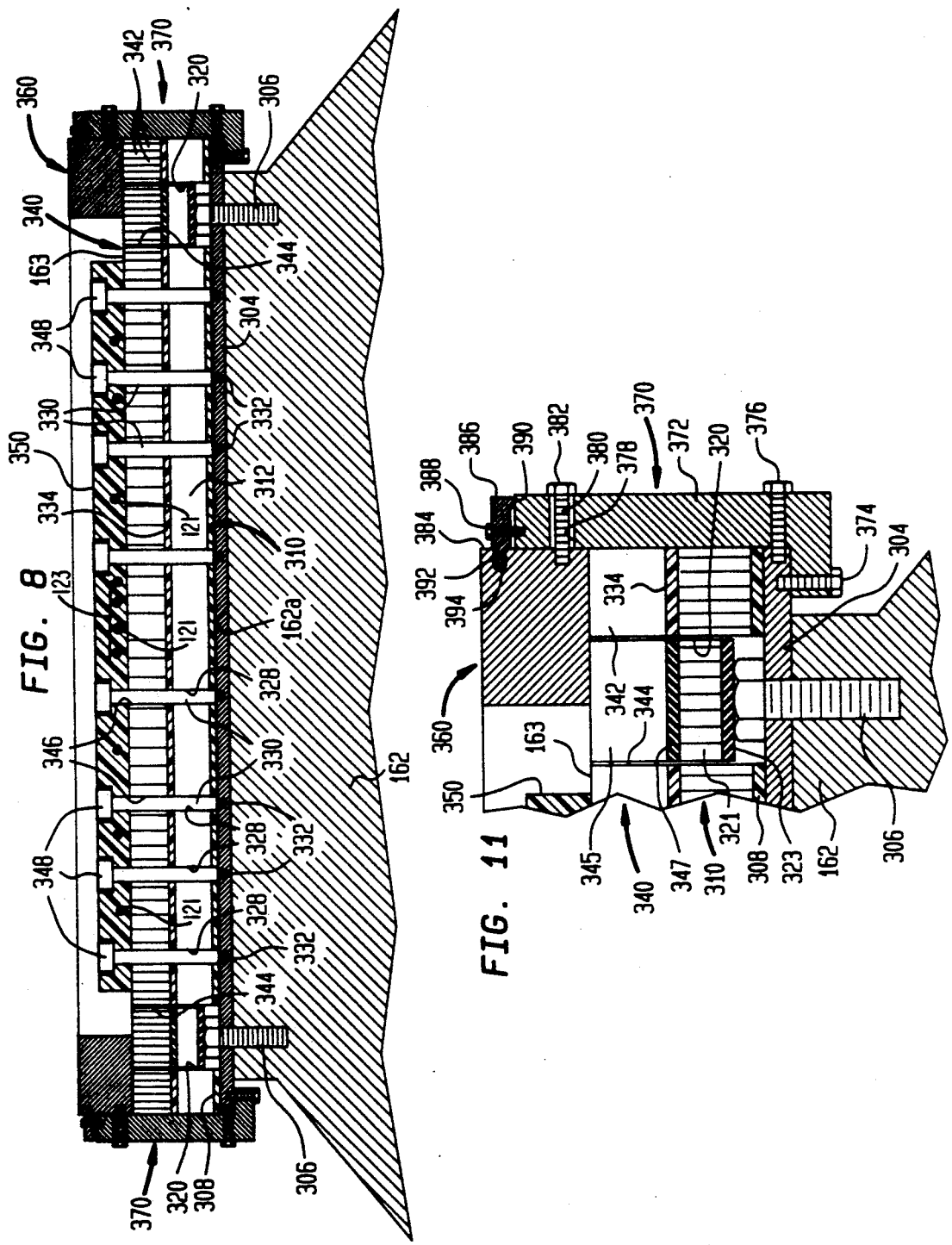
FIG. 8 is a schematic sectional elevation view, taken along the line 8—8 of FIG. 7.
Figure 9:
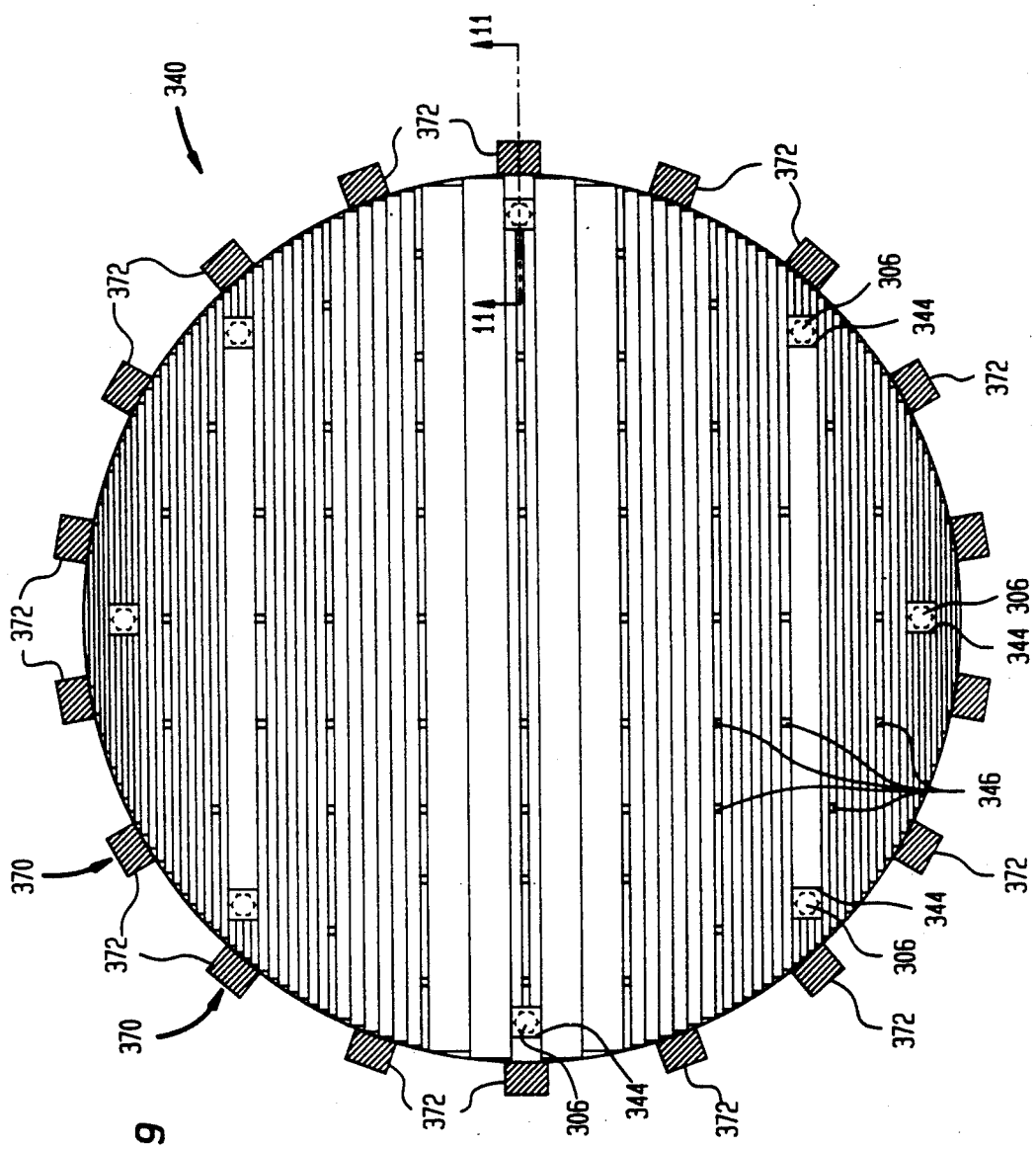
FIG. 9 is a schematic sectional plan view, taken along the line 9—9 of FIG. 7.
Figure 10:
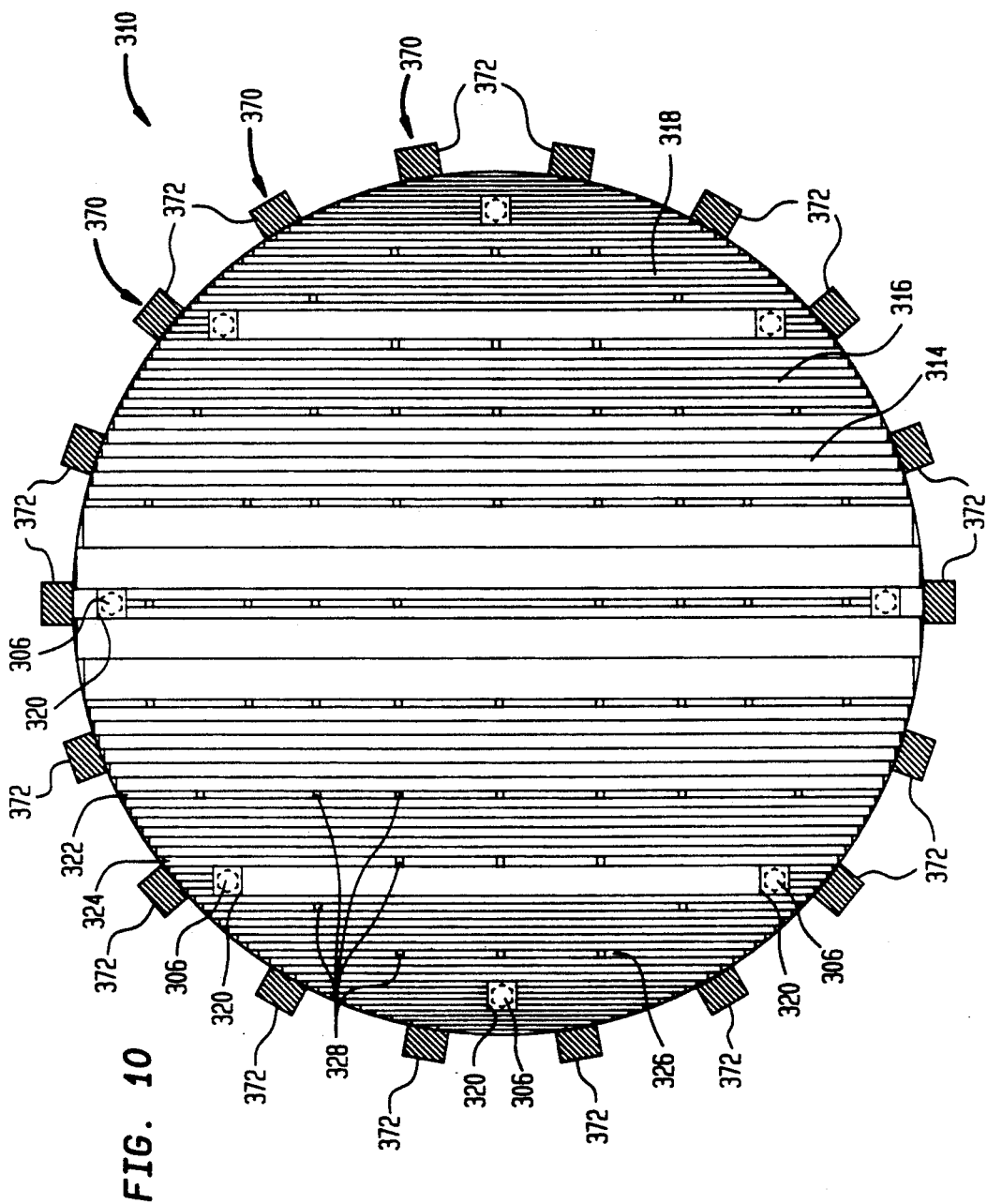
FIG. 10 is a schematic sectional plan view, taken along the line 10-10 of FIG. 7.

As shown most clearly in FIG. 10, various of the laminate groups, for example laminate groups 322, 324 and 326, are provided with discontinuities that serve to form small rectangular openings 328 at spaced intervals along the lengths of such groups of laminates. Referring to FIG. 8 the rectangular openings 328 are provided to receive rectangular studs 330 the outboard ends 332 of which threadedly engage and seat in correspondingly threaded openings formed on the inboard surface of base plate 304.

A second non-conductive separator 334 (FIG. 8) is positioned in abutment with the inboard surface of the layer 310 of laminations to electrically separate the first layer 310 from a second layer of laminations, shown generally at 340. Layers 310 and 340, although insulated from each other, are in close proximity to one another so that magnetic flux can readily flow from one layer to the other. The second layer 340 of laminations is an exact duplicate of the first layer 310 of laminations except that the planes of the individual laminations 342 of the second layer, although parallel to the polar axis 134, are rotated 90 degrees relative to the planes of the laminations 312 of the first layer 310 thereof. Thus, the planes of the laminations 342 in the second layer of laminations 340 are aligned perpendicular to the patient entry axis 154 shown in FIG. 3.

Second laminate layer 340 is also provided both with large rectangular openings 344 to accommodate bolts 306, and with additional smaller rectangular openings 346 which accommodate the rectangular studs 330. The patterns of the openings 344 and 346 in the second layer 340 of laminations, and the patterns of the openings 320 and 328 in the first layer 310 of laminations, are arranged in such a manner that the various sets of openings are in alignment with one another notwithstanding the 90 degree change in direction of the positions of the laminates in the second layer 340 relative to the first layer 310. This facilitates manufacture of the two laminate layers as exact duplicates of one another prior to their being assembled together into the laminated pole assembly 300.

As in the case of layer 310, the bolt openings 344 of layer 340 are filled with small blocks 345 of laminations after assembly of the bolts 306 to pole piece 162, so that the inboard surface of layer 340, constituting the lower pole face 163, presents a substantially continuous plane above bolts 306. Also, each filler block 345 is separated by a layer of insulating material 347 from its adjacent filler block 321.

As best seen in FIG. 8, the various rectangular studs 328 extend in an inboard direction to positions that are flush with the inboard surface of the laminate layer 340 when the assembly 300 has been compacted together, as will appear in greater detail hereafter. The inboard ends of the studs 330 are provided with threaded apertures which receive the threaded ends of corresponding bolts 348. Bolts 348 clamp an electrically non-conductive, non-magnetic disk 350 that contains the windings 121 and 123 of the gradient field coils positioned therein. The gradient field coils correspond to the gradient field coils 120 of FIG. 2. When the bolts 348 are tightened in place relative to the rectangular studs 330 the various layers 340 and 310 of laminates and the phenolic separators 308 and 334 are clamped together and against the base plate 304.

A shim ring, shown generally at 360, is provided inboard of the outer portion of the inboard surface of laminate layer 340. The shim ring 360 is preferably an annular ring made of multiple spiral turns of an elongate thin layer of ferromagnetic material but may have other configurations and be of other ferromagnetic materials such as solid iron or steel. Shim ring 360 is clamped in place inboard of the laminate layer 340 by means of a plurality of clamping means, shown generally at 370, that are positioned at equiangularly spaced locations about the laminated pole assembly 300. Referring more particularly to FIG. 11, each of the clamping means 370 includes an L-shaped bracket member 372 that is bolted to the outboard face of baseplate 304 by a first bolt 374, and is bolted to a side edge of base plate 304 by another bolt 376. The upper portion of bracket member 372 is provided with an enlarged opening or slot 378 that loosely receives the threaded shaft 380 of a bolt 382 that threadedly engages a side edge 384 of shim ring 360.

Clamping means 370 further includes a clamp member 386 that is positioned inboard of and bolted by a bolt 388 to the inboard end of bracket member 372. The clamp member 386 is provided with a protrusion 390 that extends in an outboard direction from its outboard surface into engagement with the inboard end surface of bracket member 372. Protrusion 390 serves as a pivot point that allows clamp 386 to pivot relative to bracket member 372 when the bolt 388 is taken up or tightened relative to bracket 372. Clamp member 386 is further provided with a pin 392 that engages an aperture 394 in the side edge 384 of shim ring 360. The aperture 394 is slightly greater in diameter than pin 392 so that pin 392 may tilt relative to opening 394 in connection with clamping the shim ring 360.

In order to clamp shim ring 360 against the inboard surface of laminate layer 340 and thus assist in compacting the laminated pole assembly 300 the various bolts 382 are initially loosened slightly and then bolts 388 are taken up sufficiently to cause the shim ring 360 to press against the inboard surface of laminate layer 340. When bolts 388 have been sufficiently taken up, bolts 382 are then tightened to lock the shim ring 360 in its clamping position.

In manufacturing the laminated pole assembly 300 the various components thereof, including base plate 304, separator 308, the first layer 310 of laminations, separator 334, the second layer 340 of laminations, and the various rectangular studs 382, are assembled together in a suitable circular jig or form, together with rectangular plugs (not shown) that fill the rectangular openings 320 and 344 of the layers 310 and 340, to maintain the laminates in proper spaced relationship to one another. The entire assembly of the foregoing elements is compressed together and then subjected to a "potting" procedure, during which procedure epoxy resin or a similar insulating adhesive material is forced into the interstices of the assembly to adhesively join the various elements thereof together. After the "potting" procedure has been completed and the epoxy resin or other material has hardened, the resulting cylindrical disk is removed from the potting form or jig and the aforementioned rectangular plugs are knocked out of the openings 320 and 344 of the layers 310 and 340. Thereafter, the base ring 304 of the cylindrical disk is bolted to the pole piece 162 by the various bolts 306. At this point, the shim ring 360 and the various clamping means 370 are assembled on to the cylindrical disk, and the gradient field coil disk 350 is bolted to the various rectangular studs 328 by means of the bolts 348 to complete the installation of the laminated pole assembly 300 to the pole piece 162.

A procedure similar to that described above takes place with respect to assembling the upper laminated pole assembly 302 (FIG. 7) to the upper pole piece 166 and, since the upper laminated pole assembly 302 is an exact duplicate of the lower laminated pole assembly 300, such procedure need not be further described.

The orthogonal relationship of the planes of the laminations in layers 310 and 340 corresponds to the orthogonal relationship existing between the various gradient coil windings 121 and 123 in the gradient coil assembly that is used to superimpose gradient magnetic fields on the primary field generated by the primary field magnet coils 180 and 190 of the scanner. Thus, the lengths of the laminations 312 in layer 310 extend generally parallel to the lengthwise direction of the windings 123 of the gradient coil, whereas the laminations 342 in layer 340 extend generally parallel to the lengthwise direction of windings 121.

The layers 310 and 340 of laminations in the arrangement discussed with reference to FIGS. 7-11 serve to suppress eddy currents in the underlying solid magnetic elements such as pole piece 162 in a way similar to the layer of rod like elements 67 discussed above with reference to FIGS. 1-6C. Thus, the magnetic flux from the gradient coil windings 121 and 123 passes principally through the layers 310 and 340 of laminations, rather than through the underlying solid ferromagnetic elements. Here again, because the flux from the gradient coil windings does not extend into the underlying solid ferromagnetic elements, changes in the flux from the gradient coil do not induce substantial eddy currents in the underlying structures. The laminated layers 310 and 340 offer substantial electrical resistance to the flow of eddy currents, inasmuch as the electrically non-conductive material interposed between adjacent laminations effectively blocks eddy currents passing between laminations. The crossed or othogonal laminations in the two layers provide particularly effective eddy current suppression. The laminations in each layer provide a particularly low magnetic reluctance path for magnetic flux directed generally lengthwise with respect to the laminations of that particular layer. For example, the laminations 312 of layer 310 provide a low reluctance path for magnetic flux directed generally from left to right or right to left as seen in FIG. 8, whereas the laminations 344 of layer 340 provide a low reluctance path for magnetic flux directed generally into and out of the plane of the drawing as seen in FIG. 8. Accordingly, the crossed laminations will provide a relatively low reluctance path for magnetic flux in all directions transverse to the polar axis 134 of the apparatus. In particular, laminations 344 of layer 340 provide a low reluctance path for flux generated by windings 123, whereas laminations 312 of layer 310 provide low reluctance paths for flux generated by windings 121. This aids in preventing transmission of flux from the gradient coils to the underlying structures.

Moreover, because the laminations in each layer carry flux directed generally lengthwise along the layer, they are particularly effective in suppressing eddy currents caused by changes in the flux. As the flux generated by the gradient coil windings 121 and 123 changes during operation of the apparatus, the induced electromagnetic forces in the laminations tend to cause current flow perpendicular to the planes of the individual laminations, in the thickness dimension of each lamination. For example, consider the case of an individual lamination 312 carrying lines of flux directed generally left to right as seen in FIG. 8. Assuming that the magnitude of the currents in the gradient coil windings is increased, so as to increase the flux during operation of the apparatus, more lines of flux will pass into the winding. As the additional lines of flux are created, while the current in the windings 121 is changing, they can be visualized as moving into the lamination from the top, i.e., from the edge of the lamination adjacent separator 334. Such relative motion of flux lines and an electrically conductive body tends to create an electromotive force perpendicular to both the line of flux and the direction of motion of the line of flux, i.e., an electromotive force in the direction perpendicular to the plane of the drawing in FIG. 8, i.e., in the thickness direction of the lamination. The action with respect to laminations 344 and layer 340 is substantially the same. Electromotive forces in the thickness directions of the individual laminations will not create appreciable eddy currents extending over appreciable distances within the lamination layers because currents in the thickness direction of the laminations in any given layer are effectively blocked by the non-conductive material disposed between the laminations.

The arrangements discussed above provide relatively low magnetic reluctance in the eddy current suppression layers, i.e, in the layers of rod like elements 67 and in the layers of sheet like laminations 310 and 340. This relatively low reluctance prevails for magnetic fields changing at all frequencies of interest. Typically, the reluctance through the layer should be substantially constant for all frequencies associated with the magnetic fields and with changes in the magnetic fields incident to operation of the gradient coils. Typically, such frequencies range from DC up to about 1 kHz, and hence, constant reluctance from about DC to about 1 kHz or higher is desirable. The embodiments discussed above provide such substantially constant reluctance inasmuch as the materials of the rod like elements 67 and laminations are selected to have substantially constant magnetic permeability over the frequency range of interest.

As will be appreciated, numerous variations of the features discussed above can be utilized without departing from the present invention as defined by the claims. Merely by way of example, the epoxy employed as an electrically non-conductive material in the layers discussed above can be replaced by other non-conductive materials such as ceramics. Thus, a ceramic enamel may be employed as the non-conductive material. Such ceramics are advantageous inasmuch as they provide relatively high strength bonding between the rods or laminations, and also provide good electrical insulation.

It should be clearly understood that the flux-producing elements (superconducting coils) discussed above are merely exemplary. The advantages of the invention are also obtained with ordinary resistive coils, rather than superconducting coils as used in the preferred embodiment described above. The present invention is fully applicable also to primary field magnet assemblies which utilize permanent magnets, rather than superconducting coils or ordinary resistive coils as the flux source for the primary field.

Likewise, the particular frame shape used in the embodiments discussed above having all of the components of the frame substantially symmetrical about the polar axis and about the medial plane, is merely exemplary. Thus, the flux return path components need not be symmetrical about the polar axis. For example, the frame may be generally "C" shaped, with the tips of the C defining the poles and the polar axis, and with the flux return path extending on one side only of the polar axis. Alternatively, a flux return which is symmetric with respect to the patient entry axis 154 (FIG. 3), can be configured in various ways other than the substantially cylindrical flux return shown in FIG. 3. A relatively open rectangular frame may be employed. For example, the frame shapes and flux sources discussed in U.S. Pat. No. 4,675,609 can be used in practice of the present invention. In addition, although frustoconical pole facing pieces 165 and 168 have been illustrated in FIG. 2, it will be apparent to those skilled in the art that other configurations of the pole pieces, for example cylindrical, may be employed, particularly when weaker magnetic fields are utilized.

As these and other variations and combinations of the features described above can be utilized without departing from the present invention as defined in the appended claims, the foregoing description of the preferred embodiment should be understood as being illustrative rather than as limiting the invention as defined in the claims.

What is claimed is:

1. A medical NMR scanner comprising a primary field magnet assembly including:
   a) A frame defining a patient-receiving space adapted to receive a human body, said frame having a pair of opposed polar regions aligned on a polar axis and disposed on opposite sides of said patient-receiving space;
   b) means for producing a magnetic field within said patient-receiving space by passing magnetic flux into said patient-receiving space at least partially through said polar regions;
   c) means including gradient coil windings positioned in proximity to each of such polar regions for producing gradients in said magnetic field when energized; and
   d) means for limiting eddy current generation in said polar regions when said gradient producing means is energized and for conducting magnetic flux from said polar regions toward said patient-receiving space, including an assembly of plural ferromagnetic elements in each of said polar regions, the ferromagnetic elements in each said assembly being positioned in side-by-side relation to one another, each said ferromagnetic element having its shortest dimension oriented generally transverse to said polar axis.

2. A scanner as claimed in claim 1, wherein said ferromagnetic frame includes a sold metallic element in each of said polar regions, each said solid metallic element being disposed adjacent at least one said gradient coil winding, one said assembly of plural ferromagnetic elements being disposed between each said solid metallic element and the adjacent gradient coil winding.

3. A scanner as claimed in claim 1, wherein said frame includes a pair of ferromagnetic pole pieces, each of said pole pieces extending substantially along said polar axis toward the other of said pole pieces, said pole pieces defining said polar regions, said assemblies being disposed betwen said gradient coil windings and said pole pieces.

4. A scanner as claimed in claim 3, wherein each of said pole pieces includes an inboard end portion adjacent said patient receiving space, and wherein said assemblies of ferromagnetic elements are carried by said inboard end portions of said pole pieces.

5. A scanner as claimed in claim 4, wherein said ferromagnetic elements comprise ferromagnetic rods extending generally parallel to said polar axis.

6. A scanner as claimed in claim 5, wherein each of said ferromagnetic rods is maintained transversely spaced from and out of contact with its adjacent ferromagnetic rods by a first electrically non-conductive material.

7. A scanner as claimed in claim 6, wherein each of said ferromagnetic rods includes an inboard end and an outboard end, and wherein said outboard ends of said rods are positioned adjacent to said inboard ends of said pole pieces but are separated therefrom by a second electrically non-conductive material.

8. A scanner as claimed in claim 7, wherein said first electrically non-conductive material includes an adhesive material which bonds said rods in each of one another.

9. A scanner as claimed in claim 8, wherein said second electrically non-conductive material includes adhesive material and said adhesive material also bonds said rods to said inboard ends of said pole pieces.

10. A scanner as claimed in claim 9, wherein said adhesively bonded ferromagnetic rods in each of said assemblies form a composite cylindrical disk, and further including means carried by each of said pole pieces and in engagement with the inboard ends of corresponding ones of said disks for holding the outboard ends of said disks in tight contact with the inboard ends of said pole pieces.

11. A scanner as claimed in claim 9, wherein said adhesively bonded ferromagnetic rods in each of said assemblies form a composite cylindrical disk, and further including a layer of non-magnetic material positioned intermediate the outboard ends of each of said disks and the inboard end of each of said pole pieces, and means carried by each of said pole pieces and in engagement with the inboard ends of corresponding ones of said disks for holding the outboard ends of said disks in tight contact with the inboard side of said layer of non-magnetic material.

12. A scanner as claimed in claim 5, wherein said ferromagnetic rods have maximum length dimensions that are greater than their maximum width dimensions.

13. A scanner as claimed in claim 12, wherein said rods have cross-sectional shapes selected from the group comprising triangles, quadrilaterals and polygons.

14. A scanner as claimed in claim 12, wherein the cross-sectional shapes of said rods comprise hexagons.

15. A scanner as claimed in claim 1 wherein said ferromagnetic elements comprise sheetlike laminations each having a length dimension, a width dimension and a thickness dimension substantially less than said length and width dimensions, the thickness dimension of each said sheetlike element extending transverse to said polar axis, said laminations in each said assembly being disposed in face-to-face relation with one another.

16. A scanner as claimed in claim 15, wherein said sheetlike ferromagnetic laminations comprise generally rectangular, planar, ferromagnetic laminations the planes of which are positioned generally parallel to said polar axis.

17. A scanner as claimed in claim 16, wherein each of said ferromagnetic laminations includes an inboard side edge and an outboard side edge, and wherein said outboard side edges of said laminations are positioned adjacent to but out of electrical contact with said inboard ends of said pole pieces.

18. A scanner as claimed in claim 16, wherein each of said ferromagnetic laminations is maintained transversely spaced from and out of electrical contact with its adjacent ferromagnetic laminations by an electrically non-conductive material.

19. A scanner as claimed in claim 18, wherein said electrically non-conductive material includes an adhesive material which bonds said laminations to one another.

20. A scanner as claimed in claim 19, wherein said adhesively bonded ferromagnetic laminations in each of said polar regions form respective composite cylindrical disks, and further including means carried by each of said pole pieces and in engagement with the inboard ends of corresponding ones of said disks for holding the outboard ends of said disks in position adjacent to the inboard ends of said pole pieces.

21. A scanner as claimed in claim 16, wherein said laminations in each of said assemblies include first and second layers of said generally rectangular, planar, ferromagnetic laminations, the planes of said laminations in the first said layer of each assembly being positioned generally parallel to said polar axis but generally perpendicular to the planes of the laminations in the second layer in that assembly.

22. A scanner as claimed in claim 21, wherein said gradient coil windings include a set of windings positioned in proximity to each said polar region, the windings in each said set including first windings and second windings, the first windings extending generally transverse to said polar axis, the second windings extending generally transverse to said polar axis and being generally othogonal to the first windings, each said set of windings being disposed adjacent one said assembly of said ferromagnetic elements.

23. A scanner as claimed in claim 22, wherein the first windings in each set of windings extend generally parallel to the planes of the laminations in the first layer of laminations of the adjacent assembly, and wherein the second windings in each set of windings extend generally parallel to the planes of the laminations in the second layer of laminations in the adjacent assembly.

* * * * *